United States Patent [19]

Kaiser et al.

[11] Patent Number: 5,393,698
[45] Date of Patent: * Feb. 28, 1995

[54] METHOD FOR FABRICATING SEMICONDUCTOR DEVICES

[75] Inventors: William J. Kaiser, West Covina; Frank J. Grunthaner, Glendale; Michael H. Hecht, Los Angeles; Lloyd D. Bell, Pasadena, all of Calif.

[73] Assignee: California Institute of Technology, Pasadena, Calif.

[*] Notice: The portion of the term of this patent subsequent to Dec. 29, 2008 has been disclaimed.

[21] Appl. No.: 305,378

[22] Filed: Feb. 1, 1989

[51] Int. Cl.$^6$ ............................................. H01L 21/44
[52] U.S. Cl. .................................... 437/184; 437/176; 437/179; 437/126; 148/DIG. 139; 148/DIG. 140
[58] Field of Search ............... 437/184, 107, 176, 179, 437/175, 177, 133, 190, 912, 126; 148/DIG. 139, DIG. 140, DIG. 56, DIG. 169, DIG. 65

[56] References Cited

U.S. PATENT DOCUMENTS

| | | |
|---|---|---|
| 4,186,410 | 1/1980 | Cho et al. .............................. 437/107 |
| 4,637,129 | 1/1987 | Derkit, Jr. et al. .................. 437/107 |
| 4,908,325 | 3/1990 | Berenz ....................... 148/DIG. 139 |

OTHER PUBLICATIONS

Bauer et al. "Dissociative Surface reactions at Schottky and heterojunction interfaces with AlAs and GaAs", J. Vac. Sci. & Technol. vol. 19, No. 3, pp. 674–680, Sep.-Oct. 1981.

Zirath et al. "Temperature Variable Noise and Electrical characteristics of Au–GaAs Schottky Barrier Millimeter Wave Mixer Diodes", IEEE Tran. on Micr. Theo. and Techniques, vol. 36, No. 11, Nov. 1988, pp. 1469–1475.

Howes et al. "Gallium Arsenide Materials, Devices and Circuits", 1985 by John Wiley & Son, Inc., p. 195.

Primary Examiner—Brian E. Hearn
Assistant Examiner—Tuan Nguyen
Attorney, Agent, or Firm—Leonard Tachner

[57] ABSTRACT

A process for fabricating gold/gallium arsenide structures, in situ, on molecular beam epitaxially grown gallium arsenide. The resulting interface proves to be Ohmic, an unexpected result which is interpreted in terms of increased electrode interdiffusion. More importantly, the present invention surprisingly permits the fabrication of Ohmic contacts in a III-V semiconductor material at room temperature. Although it may be desireable to heat the Ohmic contact to a temperature of, for example, 200 degrees Centigrade if one wishes to further decrease the resistance of the contact, such low temperature annealing is much less likely to have any deleterious affect on the underlying substrate. The use of the term "in situ" herein, contemplates continuously maintaining an ultra-high vacuum, that is a vacuum which is at least $10^{-8}$ Torr, until after the metallization has been completed. An alternative embodiment of the present invention comprising an additional step, namely the termination of the gallium arsenide by a two monolayer thickness of epitaxial aluminum arsenide as a diffusion barrier, enables the recovery of Schottky barrier behavior, namely a rectified I-V characteristic. The present invention provides a significant breakthrough in the fabrication of III-V semiconductor devices wherein excellent Ohmic contact and Schottky barrier interfaces to such devices can be achieved simply and inexpensively and without requiring the high temperature processing of the prior art and also without requiring the use of exotic high temperature refractory materials as substitutes for those preferred contact metals such as gold, aluminum and the like.

13 Claims, 2 Drawing Sheets

METHOD FOR FABRICATING SEMICONDUCTOR DEVICES

ORIGIN OF INVENTION

The invention described herein was made in the performance of work under a NASA contract No. NAS-7-918, and is subject to the provisions of Public Law 96-517 (35 USC 202) in which the Contractor has elected to retain title.

TECHNICAL FIELD

The present invention relates generally to the fabrication of III-V semiconductor integrated circuits and more particularly to the formation of Ohmic contacts and Schottky barrier interfaces on III-V semiconductor materials such as gallium arsenide.

BACKGROUND ART

Gallium arsenide semiconductor technology has been evolving rather quickly in recent years. This rapid evolution stems from the fact that gallium arsenide is a semiconductor material which has high electron mobility which thus holds the promise of high-performance, ultra-high speed logic circuits. The development of silicon-integrated circuits has made available a vast art encompassing lithography, surface preparation, film deposition and design. One would like to be able to apply this new technology to GaAs semiconductors, but for reasons clearly due to the difference in the nature of these materials and their surfaces, new art must be developed to advance the fabrication of dense circuits on gallium arsenide. Considerable interface investigation has been directed toward the formation of high quality Schottky barrier interfaces and low resistance Ohmic contacts for interconnections on gallium arsenide. The Schottky barrier contact can be used to control charge in the interior of gallium arsenide devices and the Ohmic contact is used by the devices to communicate with the outside world. Some of the problems associated with forming reliable and device repeatable Schottky barrier interfaces and low resistance Ohmic contacts on gallium arsenide-based systems, as well as some of the attempts in the prior art to overcome these problems, are described in an article entitled "Contact and Metallization Problems in Gallium Arsenide Integrated Circuits" by N. Braslau in the Journal of Vacuum Science Technology A, volume four (4), number six (6), November/December 1986, pages 3085 to 3090. The author of that article points out that there is a distinct trend toward the use of refractory metal contacts due to the elevated temperatures to which they are subjected during processing which cause severe degradation to the presently used gold-based metallurgy. Thus for example, the prior art requires deposition of an alloy, typically gold germanium nickel followed by an annealing process at elevated temperature to initiate interdiffusion of the contact metal with the semiconductor, gallium arsenide. Unfortunately, this process requires precise control and the high temperatures which are incompatible with other processing requirements. The metallurgy of this contact technology has been extensively studied over the past twenty years and has been shown to be chemically complex and spatially heterogeneous. Thus, it would be highly desirable to provide a method for forming Ohmic contacts on gallium arsenide surfaces at temperatures sufficiently low to preclude deleterious effects on the semiconductor structure. It would also be highly desirable to utilize such a low temperature formation process to provide Schottky barrier contacts with a characteristic barrier height for gallium arsenide that is repeatable from device to device and which has an ideality factor approaching one, by providing a uniform diffusion barrier that exhibits relatively homogeneous, spatial uniformity over the contact surface area.

Information on existing methods for preparation of Schottky barriers using chemical etching techniques may be found, by way of example, in the text entitled "VLSI Fabrication Principals-Silicon and Gallium Arsenide" by Sorab K. Ghandhi published in 1983 by John Wiley & Sons, Inc. at pages 520 to 523.

STATEMENT OF INVENTION

The present invention achieves the aforementioned goals by providing a reliable and repeatable III-V semiconductor integrated circuit device by using novel fabrication techniques to provide low resistance Ohmic contacts and high quality Schottky barrier interfaces. More specifically, the present invention relies upon a novel fabrication process utilizing molecular beam epitaxy and in situ metallization under ultra-high vacuum to provide low resistance Ohmic contacts and high quality Schottky barrier interfaces on a III-V semiconductor such as gallium arsenide and using gold metallization. More particularly, it has been discovered that for epitaxial gallium arsenide, a gold film deposited in situ, without exposure to air subsequent to the semiconductor growth, will have the desired Ohmic properties. In addition, in the present invention it has been found that such room-temperature-formed Ohmic contacts may be readily converted to Schottky barrier interfaces by the introduction of two atomic layers of aluminum arsenide grown epitaxially on the gallium arsenide without degrading the electron transport characteristics of the devices.

The Ohmic contacts produced by the process of the present invention were fabricated by first preparing a molecular beam epitaxial specimen comprising a one micrometer thick gallium arsenide layer prepared on a gallium arsenide (100) surface substrate. The gallium arsenide specimen was then transferred into a gold deposition chamber while maintaining an ultra-high vacuum such as at least $10^{-8}$ Torr. Such gold depositions performed in an ultra-high vacuum chamber, link directly to the molecular beam epitaxy system. A gold thickness of 100 Angstroms was deposited on the specimen. The Ohmic contacts prepared in this fashion yielded an Ohmic characteristic which persisted for measurements performed at 77 degrees Kelvin. The results of this novel, in situ fabrication technique, suggest that electrode interdiffusion is greatly enhanced by maintaining the ultra-high vacuum between the molecular beam epitaxy chamber and the gold deposition chamber. In order to form a rectifying interface, the molecular beam epitaxial gallium arsenide layer was terminated by a diffusion barrier consisting of two monolayers of epitaxial aluminum arsenide. The sample was then transferred again in ultra-high vacuum to the gold deposition chamber for completion of the process in the manner previously described for the Ohmic contact. The resulting device interface yielded completely restored rectifying characteristics having a Schottky barrier height of 0.88 eV and an ideality value of 1.1. Thus the termination of the gallium arsenide by a two-monolayer epitaxial aluminum arsenide diffusion barrier, inhibits the diffusion process and enables the recovery of Schottky barrier behavior unchanged relative to that of intimate gold-gallium arsenide contacts. The present invention comprises the novel fabrication process for forming Ohmic contacts and Schottky barrier interfaces in III-V semiconductor integrated circuit devices such as those utilizing gallium arsenide substrates and the devices fabricated by such process.

OBJECTS OF THE INVENTION

It is therefore a principal object of the present invention to provide a novel fabrication process for forming Ohmic contacts in III-V semiconductor-based devices, such as gallium arsenide integrated circuit devices, without requiring the use of elevated temperatures which might otherwise have deleterious effects on the underlying substrates.

It is an additional object of the present invention to provide a novel fabrication process for forming Schottky barrier interfaces in III-V semiconductor-based devices by utilizing an epitaxial grown diffusion barrier between the underlying substrate and the metal contact wherein the barrier thickness is selected to avoid affecting electron transport through the barrier.

It is still an additional object of the present invention to provide a III-V semiconductor material-based integrated circuit device having an Ohmic contact in which the metallization thereof is performed under a continuous ultra-high vacuum obviating the use of elevated temperatures which might otherwise have deleterious effects on the underlying substrate.

It is still an additional object of the present invention to provide a III-V semiconductor-based integrated circuit device having a Schottky barrier interface utilizing an ultra-thin diffusion barrier epitaxially grown on the underlying substrate between the substrate and the metallization contact to prevent interdiffusion between the metal and the underlying substrate without interfering with electron transport therebetween.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which.

DESCRIPTION OF A PREFERRED EMBODIMENT

It will be understood that as used herein, the terms "gallium arsenide" and "GaAs" comprehend III-V semiconductor materials as well as doped III-V semiconductor materials and alloys of such materials. In addition as used herein, the terms "gold" and "Au", comprehend other contact metals including, but not necessarily limited to aluminum, platinum, copper, titanium and silver. Furthermore, as used herein the terms "aluminum arsenide" and "AlAs" comprehend other suitable diffusion barrier materials such as doped AlAs. The term "in situ" as used herein, means maintaining a continuous vacuum pressure even while transferring a specimen from one chamber to another.

Figure 1:
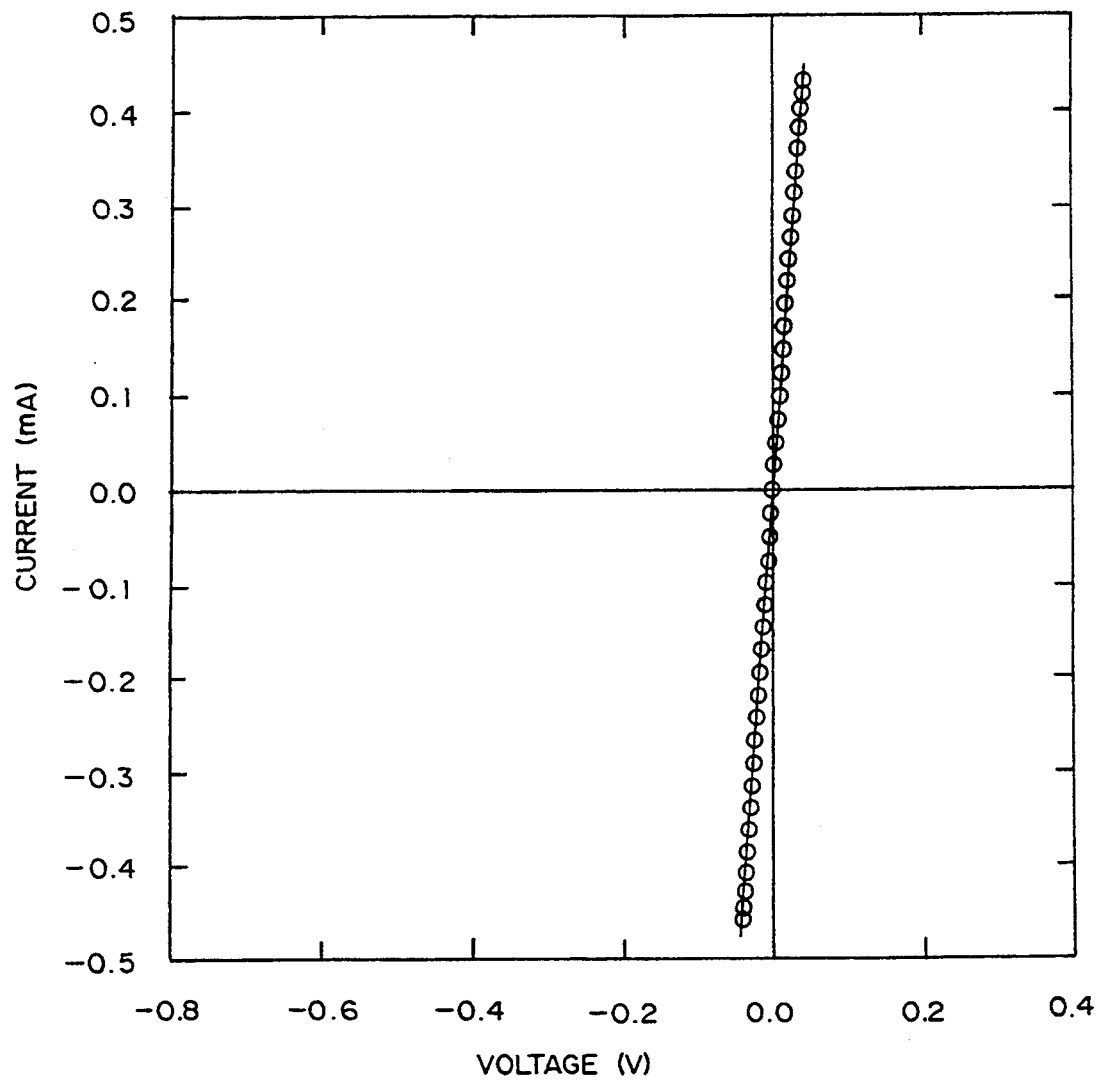
FIG. 1 is a graphical representation of a current-voltage measurement of an Ohmic contact of gold on gallium arsenide fabricated in accordance with the present invention.

The operation of any semiconductor device requires the application of a voltage or measurement of a current between the regions or junctions of the structure which have different properties. One example of such a junction is a Schottky barrier which is a rectifying junction between a metal and a base semiconductor. In order to use the device, it is necessary to provide a non-rectifying contact with the semiconductor. This is normally accomplished by diffusing the metal into the semiconductor to, in essence, short-circuit the electronic barrier between them. Contact formation on gallium arsenide typically follows controlled deposition of a multi-component alloy followed by annealing at elevated temperatures to initiate diffusion. Unfortunately, as previously pointed out, such elevated temperatures are likely to have a deleterious effect on the underlying substrate. Metal films deposited at room temperature on the (100) surface of gallium arsenide have until the present invention been found to be rectifying, that is to form a Schottky barrier. Consequently, until the present invention, it has been necessary to form Ohmic contacts by heating the contact area to a temperature of at least 350 degrees centigrade. Thus the novelty of the Ohmic contact formation process of the present invention resides primarily in the unique ability to form Ohmic contacts on gallium arsenide using a preferred contact metal such as gold and being able to do so at room temperature. The present invention thereby obviates the prior art requirement for using elevated temperatures to form the Ohmic contact in order to avoid inadvertently forming a Schottky barrier. In a reduction to practice of the Ohmic contact formation process of the present invention a one micrometer layer of gallium arsenide has been deposited on an underlying gallium arsenide substrate by using the technique of molecular beam epitaxy. This epitaxial process produced a clean, smooth, well-ordered surface as compared to melt-grown material. The sample was then transferred under ultra-high vacuum to a metallization chamber where a gold dot, ten nanometers thick, was deposited from a filament onto the epitaxial layer. The sample was then removed from the chamber and the current voltage characteristics were measured. These characteristics are shown in FIG. 1. The Ohmic characteristic is demonstrated by the proportionality between current and voltage and the symmetry with respect to zero voltage. In this particular reduction to practice the epitaxially grown gallium arsenide layer was silicon doped ($n = 5 \times 10^{16}$ cm$^{-3}$) and deposited on an n-GaAs (100) substrate. Gold deposition was performed at a base vacuum pressure of $1 \times 10^{-11}$ Torr in a chamber linked directly to the molecular beam epitaxial system. The gold thickness used was 100 Angstroms, as measured by a quartz crystal oscillator. The vacuum pressure during transfer of the specimen from the molecular beam epitaxy chamber to the metallization chamber was maintained below $10^{-8}$ Torr. Samples prepared by this method exhibited an Ohmic contact characteristic in all cases and this Ohmic characteristic persisted for measurements performed at temperatures as low as 77 degrees Kelvin. The results of this novel in situ fabrication technique suggest that electrode interdiffusion is greatly enhanced. The process for performing this embodiment of the invention, namely a method for forming an Ohmic contact on a gallium arsenide substrate, comprises the steps of epitaxially depositing a layer of gallium arsenide on an underlying substrate of gallium arsenide within a chamber in which a substantial vacuum is maintained and then depositing a layer of gold on the epitaxial layer of gallium arsenide while continuously maintaining the substantial vacuum. Whether or not the specimen must be transferred to a second chamber in order to perform the metallization step of the process, as long as the ultra-high vacuum is maintained, it is deemed to be an in situ process because at no time is the vacuum removed from the specimen until after the gold contact has been applied.

The applicants have found that by employing a diffusion barrier consisting of two monolayers of epitaxial aluminum arsenide, the rectifying characteristics of a Schottky barrier are completely restored. The rectifying metal/semiconductor contact, commonly called Schottky barrier, is an essential component of most gallium arsenide-based electronic devices. The in situ processing technique of the present invention is also highly desireable for fabricating a Schottky barrier contact, in order to overcome the sensitivity of these devices to contamination and handling. The solution is readily provided by the present invention wherein an epitaxially grown ultra-thin III-V semiconductor film, in the preferred embodiment aluminum arsenide, is used to form a diffusion barrier prior to gold deposition. This film must be thin enough so that it does not form an electronic barrier, but only a chemical barrier. In practice, this has been accomplished with two atomic layers of aluminum arsenide which constitutes a barrier that is less than one nanometer in thickness. It is anticipated that such an epitaxial diffusion barriers will have other related application such as the prevention of dopant interdiffusion at a junction between regions of different doping.

The rectifying diode formed with an epitaxial diffusion barrier in the manner described herein, has a Schottky barrier height of 0.88 eV and an ideality of 1.1. This barrier height is characteristic of gallium arsenide, indicating that the aluminum arsenide film is too thin to affect electron transport.

Figure 2:
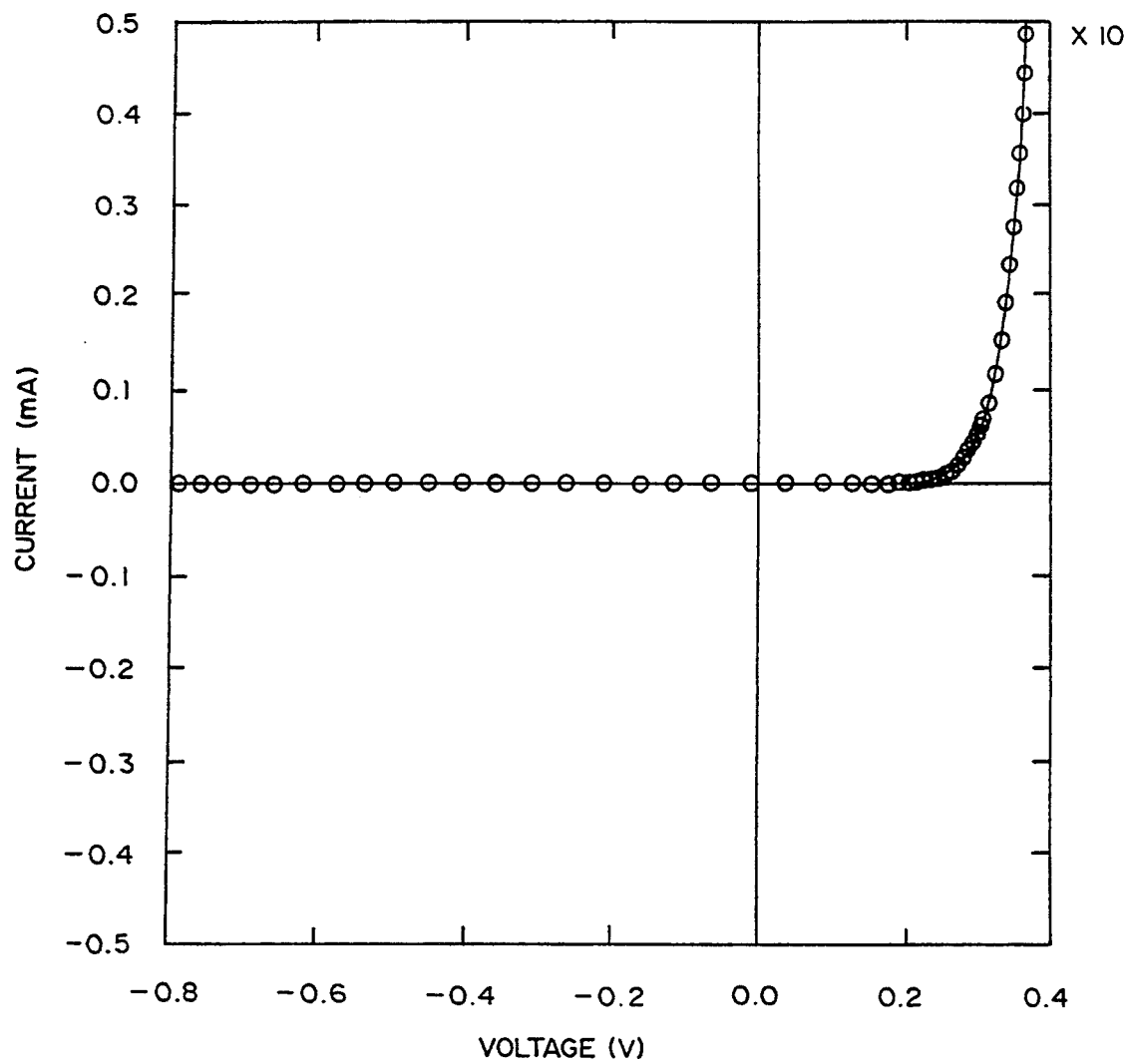
FIG. 2 is a graphical representation of a current-voltage measurement of a Schottky barrier of gold on gallium arsenide with an aluminum arsenide diffusion barrier fabricated in accordance with the present invention.

It has been found using ballistic electron emission microscopy (BEEM) that the spatial uniformity of this diode is significantly better than the conventional Schottky barrier formed on an air-exposed material where the contaminated oxidized surface layer forms a non-uniform diffusion barrier as well as an electronic conduction barrier. Ballistic electron emission microscopy is a new method for spatially resolved spectroscopic investigation of subsurface interface structure developed by two of the inventors herein and described in an article entitled "Scanning Tunneling Microscopy Methods for Spectroscopic Imaging of Subsurface Interfaces" by L. D. Bell and W. J. Kaiser at pages 1231 through 1236 of Scanning Microscopy, Volume 2, Number 3 1988. A typical current voltage spectrum of a Schottky barrier in a gallium arsenide semiconductor fabricated in accordance with the process of the present invention is shown in FIG. 2.

A BEEM image indicates a decrease in interface heterogeneity in comparison to chemically prepared samples. In particular, there is a drastic decrease in the number of areas which show no collector current. This corresponds to an increased percentage of overall interface area which is transparent to the ballistic electron probe. In addition, the magnitude of the collected current measured both by imaging and spectroscopy is comparable to that measured for chemically prepared Schottky barrier samples indicating that the collected current is not attenuated by the addition of the aluminum arsenide barrier. Furthermore, the Schottky barrier height measured by BEEM spectroscopy, yields a value which is in agreement with the values obtained for chemically prepared samples. These barrier height measurements, both by I-V and BEEM spectroscopy, indicate that the band alignment between the gold and gallium arsenide is not strongly affected by the interposition of the aluminum arsenide layer.

It will now be understood that what has been disclosed herein comprises a process for fabricating gold/gallium arsenide structures, in situ, on molecular beam epitaxially grown gallium arsenide. The resulting interface proves to be Ohmic, an unexpected result which is interpreted in terms of increased electrode interdiffusion. More importantly, the present invention surprisingly permits the fabrication of Ohmic contacts in a III-V semiconductor material at room temperature. Although it may be desireable to heat the Ohmic contact to a temperature of, for example, 200 degrees Centigrade if one wishes to further decrease the resistance of the contact, such low temperature annealing is unlikely to have any deleterious effect on the underlying substrate. The use of the term "in situ" herein, contemplates continuously maintaining an ultra-high vacuum, that is a vacuum which is at least $10^{-8}$ Torr, until after the metallization has been completed.

An alternative embodiment of the present invention comprising an additional step, namely the termination of the gallium arsenide by a two monolayer thickness of epitaxial aluminum arsenide as a diffusion barrier, enables the recovery of Schottky barrier behavior, namely a rectified I-V characteristic. As a result, it will be seen that the present invention provides a significant breakthrough in the fabrication of III-V semiconductor devices wherein excellent Ohmic contact and Schottky barrier interfaces to such devices can be achieved simply and inexpensively and without requiring the high temperature processing of the prior art and also without requiring the use of exotic high temperature refractory materials as substitutes for those preferred contact metals such as gold, aluminum and the like.

Those having ordinary skill in the art to which the present invention pertains will now, as a result of the applicants' teaching herein, perceive various modifications and additions which may be made to the invention. By way of example, while the fabrication process of the present invention has been disclosed in the form of a preferred embodiment which uses molecular beam epitaxial growth techniques, it will be understood that other deposition techniques, such as for example, molecular chemical vapor deposition may also be suitable. Furthermore, other materials, besides those materials specifically disclosed herein, may be useful for accomplishing the process and achieving the device resulting therefrom as disclosed herein. By way of example, the present invention should not be limited to only gallium arsenide as it may also be suitable for processing integrated circuit devices made of other III-V semiconductor materials. Furthermore, the contact metal disclosed herein, namely, gold, may not be the only suitable contact metal for use in the manner described. For example, aluminum, platinum, titanium, copper, silver and other metals may also be suitable as a contact metal for use in the fabrication of a device employing the present invention. In addition, the barrier material, that is the material interposed between the contact metal and the underlying substrate, may not necessarily be limited to pure aluminum arsenide, but may also include other materials including doped aluminum arsenide as an example. Accordingly, it will be understood that all such modifications and additions are deemed to be within the scope of the invention which is to be limited only by the claims appended hereto.

We claim:

1. A method of forming a Schottky barrier contact on a GaAs substrate; the method comprising the steps of:
    a) epitaxially depositing a layer of GaAs on said underlying substrate of GaAs within a chamber in which a substantial vacuum is maintained;
    b) epitaxially depositing a unit cell thickness of AlAs on said epitaxial layer of GaAs;
    c) depositing a layer of gold on said epitaxial layer of AlAs; and
    d) continuously maintaining said substrate under a substantial vacuum while performing steps a), b), and c).

2. The method recited in claim 1 wherein said substantial vacuum is at least $10^{-8}$ Torr.

3. The method recited in claim 1 wherein said layer of GaAs is about 1 $\mu$m thick.

4. The method recited in claim 1 wherein said GaAs substrate is n-type.

5. The method recited in claim 1 further comprising the step of transferring said substrate from an epitaxial chamber after performing step b) to a metalization chamber for performing step c) while continuously maintaining said substantial vacuum.

6. The method recited in claim 1 wherein steps a) and b) are performed by molecular beam epitaxy.

7. A method of forming a Schottky barrier contact on a III-V semiconductor substrate; the method comprising the steps of:
    a) epitaxially depositing a layer of said III-V semiconductor on said underlying substrate within a chamber in which a substantial vacuum is maintained;
    b) epitaxially depositing a layer of a reactive diffusion barrier material on said epitaxially deposited III-V semiconductor layer;
    c) depositing a layer of contact metal on said diffusion barrier material; and
    d) continuously maintaining said substrate under a substantial vacuum while performing steps a), b), and c).

8. The method recited in claim 7 wherein said substantial vacuum is at least $10^{-8}$ Torr.

9. The method recited in claim 7 wherein said layer of III-V semiconductor is about 1 $\mu$m thick.

10. The method recited in claim 7 wherein said layer of diffusion barrier material is about a unit cell in thickness.

11. The method recited in claim 7 wherein said underlying substrate is n-type.

12. The method recited in claim 7 further comprising the step of transferring said substrate from an epitaxial chamber after performing step b) to a metallization chamber for performing step c) while continuously maintaining said substantial vacuum.

13. The method recited in claim 7 wherein steps a) and b) are performed by molecular beam epitaxy.

* * * * *